United States Patent [19]

McCarthy et al.

[11] Patent Number: 5,398,822
[45] Date of Patent: Mar. 21, 1995

[54] ENCLOSURE FOR ELECTRONIC MODULES

[75] Inventors: William F. McCarthy, Marblehead; Colin E. Brench, Stow; Daniel M. Snow, Maynard, all of Mass.

[73] Assignee: Digital Equipment Corporation, Maynard, Mass.

[21] Appl. No.: 150,608

[22] Filed: Nov. 10, 1993

Related U.S. Application Data

[62] Division of Ser. No. 893,398, Jun. 4, 1992, Pat. No. 5,289,347.

[51] Int. Cl.6 .............................................. A47F 5/00
[52] U.S. Cl. ...................................................... 211/41
[58] Field of Search .................. 211/41, 184; 361/809, 361/415

[56] References Cited

U.S. PATENT DOCUMENTS

| | | | |
|---|---|---|---|
| 2,986,281 | 5/1961 | Jordan | 211/41 |
| 3,231,785 | 1/1966 | Calabro . | |
| 3,258,649 | 6/1966 | Arguin et al. | |
| 3,465,891 | 9/1969 | DeRose | 211/41 |
| 3,580,981 | 5/1971 | Lamp et al. . | |
| 3,899,721 | 8/1975 | Borchard et al. | 211/41 X |
| 4,022,326 | 5/1977 | Marconi | 211/41 |
| 4,214,292 | 7/1980 | Johnson | 211/41 X |
| 4,249,033 | 2/1981 | Darakjy et al. . | |
| 4,716,495 | 12/1987 | Craker . | |
| 4,728,160 | 3/1988 | Mondor et al. . | |
| 4,779,744 | 10/1988 | Shely et al. | 211/41 |
| 4,821,145 | 4/1989 | Corfits et al. . | |
| 4,894,753 | 1/1990 | Wadell et al. . | |
| 4,903,170 | 2/1990 | Finney et al. . | |
| 4,976,358 | 12/1990 | Stickel et al. . | |
| 4,991,062 | 2/1991 | Nguyenngoc . | |
| 5,030,793 | 7/1991 | McCarthy . | |
| 5,044,506 | 9/1991 | Brown | 211/41 |
| 5,118,904 | 6/1992 | Nguyenngoc . | |
| 5,119,273 | 6/1992 | Corda . | |
| 5,289,347 | 2/1994 | McCarthy et al. . | |
| 5,296,692 | 3/1994 | Shino . | |

FOREIGN PATENT DOCUMENTS 3-224298  10/1991  Japan .................................. 361/799

OTHER PUBLICATIONS

*Product Engineering,* "8 More Printed-Circuits," Jun., 1963, Irwin Schuster, p. 96.

*Primary Examiner*—Alvin C. Chin-Shue
*Assistant Examiner*—Sarah L. Purol
*Attorney, Agent, or Firm*—Arnold, White & Durkee

[57] ABSTRACT

A Faraday shield minimizes the leakage of electromagnetic interference (EMI) and radio frequency interference (RFI) of a maximum frequency and corresponding wavelength that emanates from electronic components contained within the shield. The top and bottom each contain apertures that are dimensioned to effectively block the escape of EMI and RFI from the shield and to permit the flow of air to dissipate heat without generating acoustic noise. The thickness of the top of the shield is at least one half of the diagonal length across the largest of the apertures located in the top. The length of the longest aperture side is less than one fourth of the wavelength of the maximum frequency of EMI and RFI contained by the shield. Corresponding relationships exist between the apertures located in the shield bottom and its thickness.

5 Claims, 4 Drawing Sheets

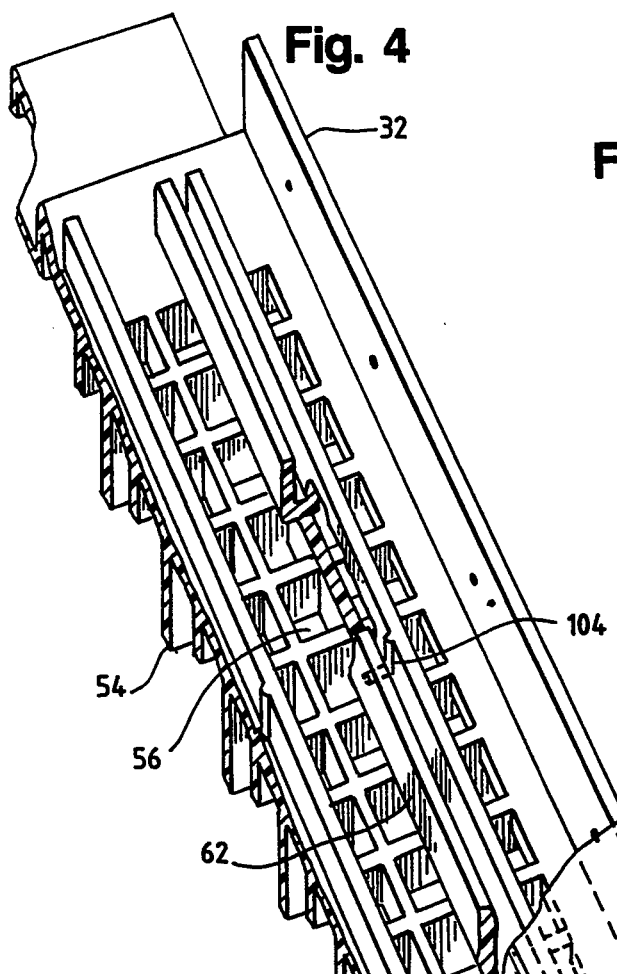
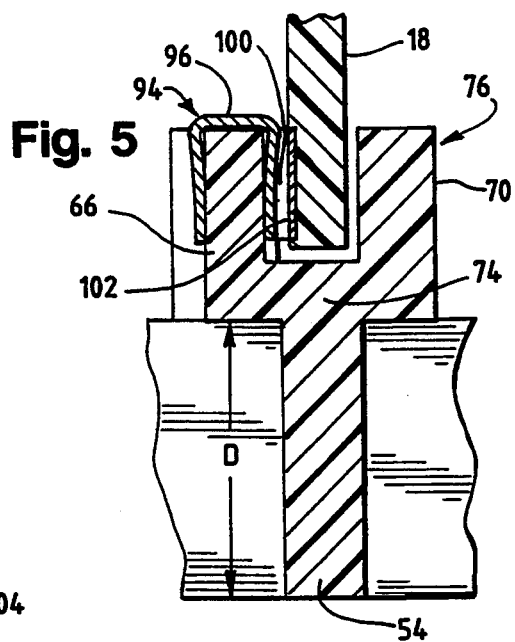
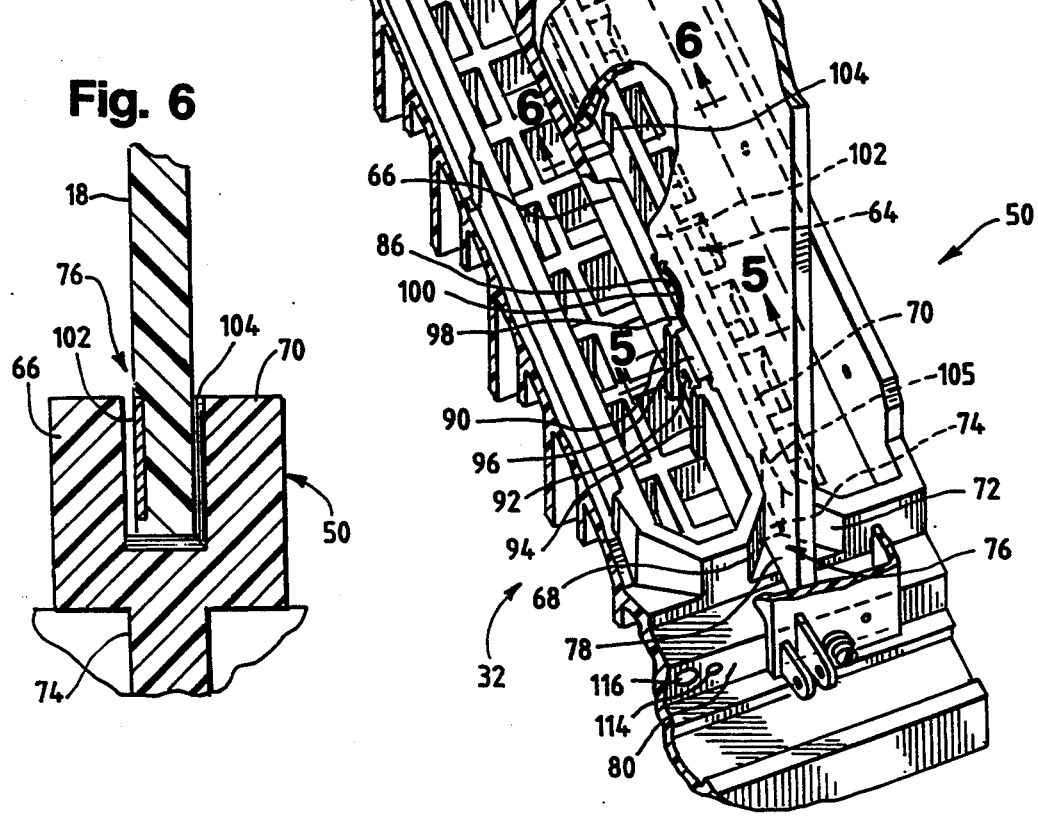
Fig. 4
Fig. 5
Fig. 6

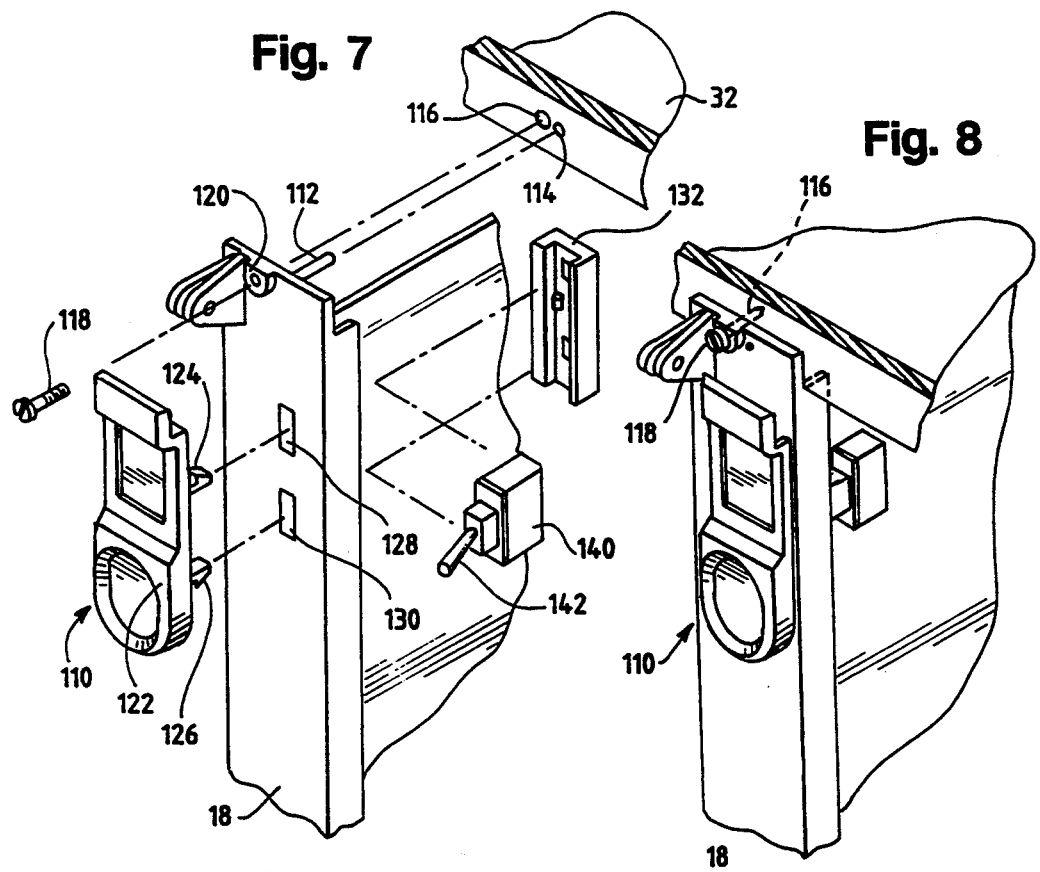

ENCLOSURE FOR ELECTRONIC MODULES

CROSS-REFERENCE TO RELATED APPLICATIONS

This application is a divisional of application Ser. No. 07/893,398, filed Jun. 4, 1992, now U.S. Pat. No. 5,289,347.

FIELD OF THE INVENTION

The present invention relates to enclosures for receiving and housing various electronic modules or cards and which acts as a Faraday shield to prevent emissions of electromagnetic interference (EMI) and radio frequency interference (RFI). Counterbalancing the desire to prevent emissions is the thermodynamic requirement to dissipate heat, since the electronic modules or cards create heat during operation. Accordingly, this type of enclosure must be adequately vented for heat dissipation without having the movement of air create undesirable noise. In addition, since the electronic modules or cards may be frequently removed and reinserted, contact between the module or card and the enclosure should not cause wear to the enclosure resulting in damage or the release of contaminants. Furthermore, during insertion of the module or card any static electric charge on the module or card must be dissipated. Finally, the module or card must be prevented from being withdrawn while power is being applied to the module or card to prevent damage or interruption to the operation of other modules or cards.

BACKGROUND OF THE INVENTION

In known enclosures for receiving and housing electronic modules or cards containing electronic components, the RFI/EMI emissions are contained by enveloping the enclosure in a sheet metal shroud and plating the plastic components of the housing. The sheet metal shroud typically has a plurality of small holes for ventilation and either completely covers the enclosure or at least covers substantial portions of the enclosure. This sheet metal shroud is effective in preventing RFI/EMI emissions from the electronic components but adds substantial weight to the overall enclosure. In addition, if aluminum foil is used instead of sheet metal, the overall material cost is increased.

Known enclosures that provide the necessary Faraday shield through the use of sheet metal typically have a plurality of small holes for ventilation, typically, one-eighth of an inch in a material with the thickness of approximately one-sixteenth inch. Any large openings to permit air flow also permit the release of RFI/EMI emissions. Known enclosures use fans to move air through these small openings to dissipate the heat generated by the electrical components. However, in order to adequately cool such known systems, the volume of air flow through the relatively small apertures create an air turbulence noise. When the enclosure is placed in an otherwise quiet work environment, the air flow noise is a source of irritation and distraction to workers in the area.

In a typical enclosure, the electronic modules or cards are inserted into guides or channels which orient the modules or cards within the enclosure. The frequent removal and reinsertion of the modules or cards within the guides of the enclosure cause wear to the surface of the guides. The wear of the guides results in the release of small particles of conductive material which can settle on the modules or cards and cause damage to sensitive electronic components and connections. Furthermore, the removal of material from the guides can create a hole in the Faraday shield and the leakage of emissions.

When a module or card is inserted into the enclosure, electrostatic discharge (ESD) resulting from a static electric charge build-up on the module or card can be transferred throughout the entire system, causing damage to sensitive components. In order to eliminate damage to system components from ESD, known methods include static pads that the operator stands on during assembly and various sprays to remove static electricity. These methods are relatively ineffective and require operator cooperation. The specification for the IEEE Futurebus, which is defined by IEEE P896.2, requires some form of positive discharge of static electricity between the module or card and the enclosure. Of course, the Futurebus specification and other relevant specifications, such as the IEEE Standard for a Metric Equipment Practice for Microcomputers Coordination (IEEE P1301) do not prescribe any physical structure to achieve the desired static discharge.

In known enclosures, the modules or cards if withdrawn while power is present can cause a power surge resulting in damage to other modules or cards or a disruption in their operation. If a module or card is inserted into an enclosure that has power being supplied to other modules or cards, damage because of high current inrush is possible. In order to prevent the withdrawal of modules or cards, various electronic circuits or mechanical locking devices have been developed. The complexity of the mechanical locking devices increases the cost of materials and assembly of the enclosure.

SUMMARY OF THE INVENTION

The present invention is an enclosure for receiving and holding a plurality of electronic modules or cards and which provides a Faraday shield to prevent EMI/RFI emissions. The enclosure has an upper chamber, a card cage subtending the upper chamber and a bottom chamber subtending the card cage. The card cage has plastic molded top and bottom card guides which are mirror images of each other. Each card guide has an electrolysis nickel over electrolytic copper plating to provide conductivity. Each card guide has a plurality of molded slots or channels to receive the electronic modules or cards. A grid subtends the channels and has a plurality of openings. The size of the openings are selected to balance the functional requirements of suppressing EMI/RFI emissions and allowing for adequate air flow to dissipate heat without causing acoustic noise. The sides of the card cage are formed out of sheet metal or similar material to form a part of the Faraday shield. The back of the card cage has a sheet metal or similar material rear panel and a backplane assembly for providing electrical connection for the electronic modules or cards. The front panel of the card cage comprises a plurality of module bulkheads which are plated as described above and form the front portion of the electronic modules or cards. The top and bottom card guides, the sides, rear panel and front panel are connected together in any manner well known in the field to complete the Faraday shield. The upper chamber contains at least one fan to draw air from the bottom chamber through the card cage to dissipate the heat created by the electronics.

Each slot or channel in the top and bottom card guides of the card cage compresses two substantially parallel spaced apart wall portions and a bottom portion. In the bottom card guide one of the wall portions has a slight recess or offset. An anti-static clip is partially positioned within the recess of the wall portion. The clip has a saddle portion which fits over the wall portion and a bowed portion which extends into the channel and contacts a conductive static strip formed along the bottom of each electronic module or card. When the bowed portion of the clip contacts the electronic module or card static strip, the bowed portion compresses, which forces its distal end to extend further into the recess in the wall thereby assuring an electrical contact between the anti-static clip and the module or card to dissipate the static electric charge accumulated on the module or card. At the same time, the bias pressure from the clip aligns the module or card within the channel. The recess restrains the clip from horizontal movement along the slot wall when the electronic module or card is inserted. The top card guide of the card cage is an identical mirror image in structure but does not have an anti-static clip mounted in the same fashion. In the preferred embodiment, a pair of posts are formed in the side of the wall opposite the channel. These posts are spaced apart and the saddle portion of the clip fits between the posts. The posts act as a positive locking structure to prevent the clip from being dragged along the wall when a card is inserted.

Several raised ribs or bumps are spaced along the bottom and one side wall of each slot or channel in the bottom card guide. As the electronic module or card is inserted into the channel or slot, it contacts and rides on the raised ribs. Since the electronic module or card is somewhat abrasive to the plated card guide, the raised ribs wear with each insertion or withdrawal. As the raised ribs wear, small amounts of conductive material are released within the enclosure. However, the amount of the raised rib wear is minimal compared to the wear caused by the electronic module or card contacting the entire length of the channel bottom. Furthermore, even when the raised ribs wear there is created only a small hole in the Faraday shield which is insufficient to leak emissions. In the preferred embodiment, the top card guide does not have the wear ribs since the top of the card does not rub against the bottom of the channel in the top card guide and there is no clip to right justify the position of the card against the right wall of the channel.

Each module or card has an interlock actuator switch assembly which connects or disconnects the power to the specific module or card. The module or card is inserted with the actuator switch in the "off" position and only after the module or card is inserted is the actuator switch moved to the "on" position, thereby providing electrical power to the module or card. When the module or card is in the proper position, the card or module is affirmatively affixed to the enclosure by screws or other suitable means. The interlock actuator switch assembly in the "on" position providing power to the module or card, it mechanically blocks the securing means or screw so that the module or card can not be physically removed from the enclosure without disconnecting power to the card or module by moving the interlock actuator switch assembly to the "off" position.

BRIEF DESCRIPTION OF THE DRAWINGS

The advantages of the invention will become apparent upon reading the following detailed description and upon reference to the accompanying drawings, in which:

FIG. 4 is a detail view of a portion of the bottom card guide showing both the ribs and anti-static clip.

FIG. 5A is a cross section of the ribs along line 5—5 of FIG. 4.

FIG. 6 is a cross section of the anti-static clip along line 6—6 in FIG. 4.

FIG. 7 is an exploded view of the interlock actuator switch assembly of the present invention.

FIG. 8 is a partial view of the interlock assembly in the "off" position prior to insertion of the module or card into the enclosure.

FIG. 9 is a back perspective view of the interlock assembly showing its connection to the card or module.

FIG. 10 is a side view of the interlock assembly in the "off" position.

FIG. 11 is a side view of the interlock assembly in the "on" position.

Figure 1:
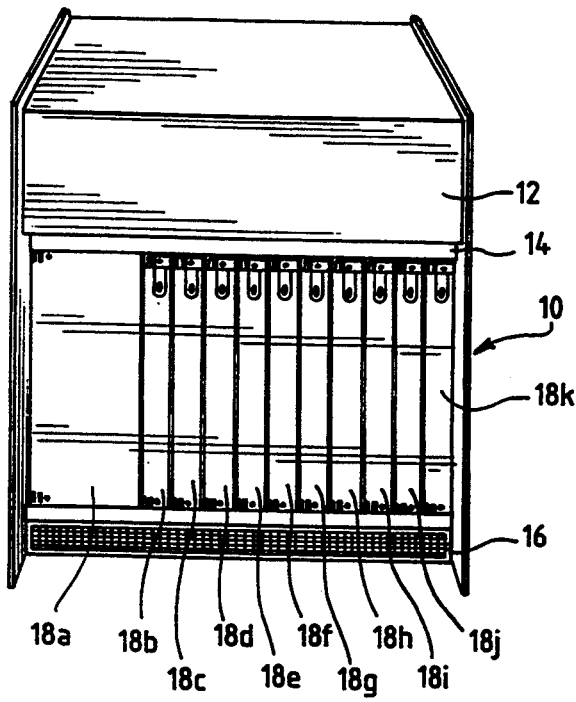
FIG. 1 is a perspective view of the enclosure of the present invention.

While the invention is susceptible to various modifications and alternative forms, specific embodiments thereof have been shown by way of example in the drawings and will be described in detail herein. It should be understood, however, that the invention is not intended to be limited to the particular forms disclosed. On the contrary, the applicant's intention is to cover all modifications, equivalents, and alternatives falling within the spirit and scope of the invention as defined by the appended claims.

DETAILED DESCRIPTION OF THE INVENTION

The present invention is an enclosure for receiving and holding a plurality of electronic modules or cards and which establishes a Faraday shield around the electronic modules or cards to prevent RFI/EMI emissions. In the preferred embodiment, the Faraday shield comprises top and bottom molded plastic card or wave guides which are plated. It should be noted that other materials for the card guides could be used, such as a conductive fiber embedded molded plastic. However, if a different material is used, additional steps are sometimes required in the assembly of the card cage, such as if a plastic with conductive fiber is used, the surface conductivity at the points or the locations of mating with other parts must be enhanced, typically by removing the resin layer or coating. These card or wave guides have a plurality of molded channels to receive the modules or cards and an open face grid with sufficiently large openings for air flow without acoustic noise and yet preventing RFI/EMI emissions. Each card guide has a plurality of three-sided or U-shaped channels for receiving the modules or cards. The channels of the bottom card guide include a plurality of raised ribs along at least the bottom surface of the channel. In the preferred embodiment the ribs also extend up one wall of the channel. The raised ribs support the card during insertion and removal to prevent excessive wear in the channel which causes particle contamination and/or a breach of the Faraday shield. Each channel of the bottom card guide also includes an anti-static clip secured in a recess and designed to engage a static strip on each card. Finally, each face plate for each module which forms a portion of the Faraday shield, includes an interlock actuator switch assembly that prevents the electronic module or card from being withdrawn from the enclosure until power to that card is removed.

Referring now to the drawings, wherein the reference characters designate like or corresponding parts throughout the views, FIG. 1 is a perspective view of an enclosure 10 according to the present invention. Throughout the various figures many detailed portions of the enclosure have been deleted for the sake of clarity and other parts are shown in diagrammatic form to better illustrate the invention. The enclosure 10 has a top chamber or compartment 12, a card cage 14 and an open bottom chamber 16. The card cage 14 is adapted to receive a plurality of electronic modules or cards 18a–18k. Of course, the number of electronic modules or cards involved can be increased or decreased without departing from the scope of the present invention. Furthermore, the function or purpose of the electronic components on any module or card does not have any bearing on the present invention. In the preferred embodiment, space is allocated for a power supply module 18a and then ten cards 18b–18k. In the preferred embodiment, the power supply is enclosed in a metal housing and, accordingly, does not add EMI/RFI emission into the card cage 14. At least one fan 20 shown diagrammatically (FIG. 2) is mounted in the top compartment 12 to draw air from the open bottom compartment 16 through the card cage 14, as described in detail hereinafter.

Figure 2:
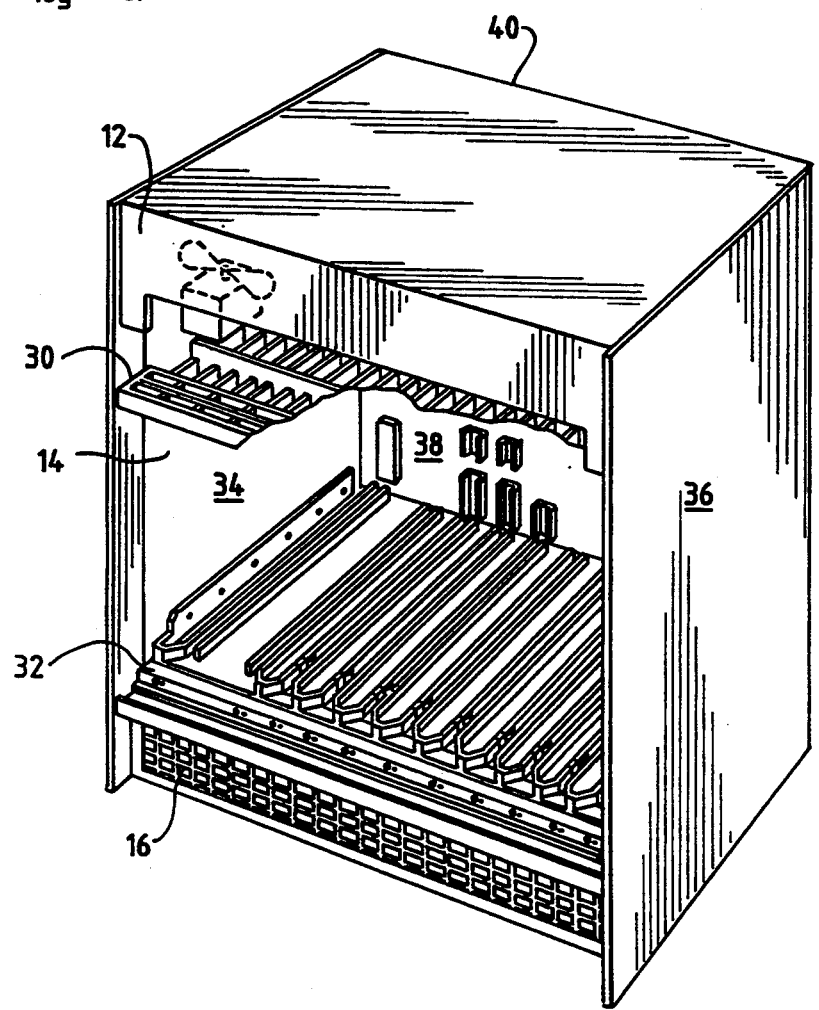
FIG. 2 is a perspective view of the enclosure of the present invention with the panel to the top chamber removed and the electronic modules or cards removed.

FIG. 2 is a perspective view of the enclosure 10 with the front of the top chamber 12 removed and the electronic modules or cards 18a–18k removed. The bulkheads or face plate of each electronic module or card forms the front of the card cage 14 as is well-known in the field. A fan 20 is shown in phantom on the top chamber 12 and can be mounted in any well-known manner. The top of the card cage 14 is the wave or card guide 30 and the bottom is the substantially identical mirror image wave or card guide 32. In the preferred embodiment, there are some minor differences between the card guides 30 and 32. The details of the structure of the card guides 30 and 32 are set forth hereinafter. The card cage 14 has a left side 34 and a right side 36 made of sheet metal or similar material. A backplane 38 for connection of the electronic modules or cards 18a–18k is shown in diagrammatic form only since it forms no part of the present invention. The card cage 14 has a back panel 40 behind the backplane 38 and is made of sheet metal or similar material. The card cage 14 prevents RFI/EMI emissions from the electronic components on the modules or cards 18a–18k. The card guides 30 and 32 are riveted or otherwise connected to the side walls 34 and 36 and the rear panel 40 and the various bulkheads or face plates are assembled in a manner well-known in the field. The card or wave guides 30 and 32 are made of molded plastic with electrolyses nickel over electrolytic copper plating to provide conductivity.

Figure 3:
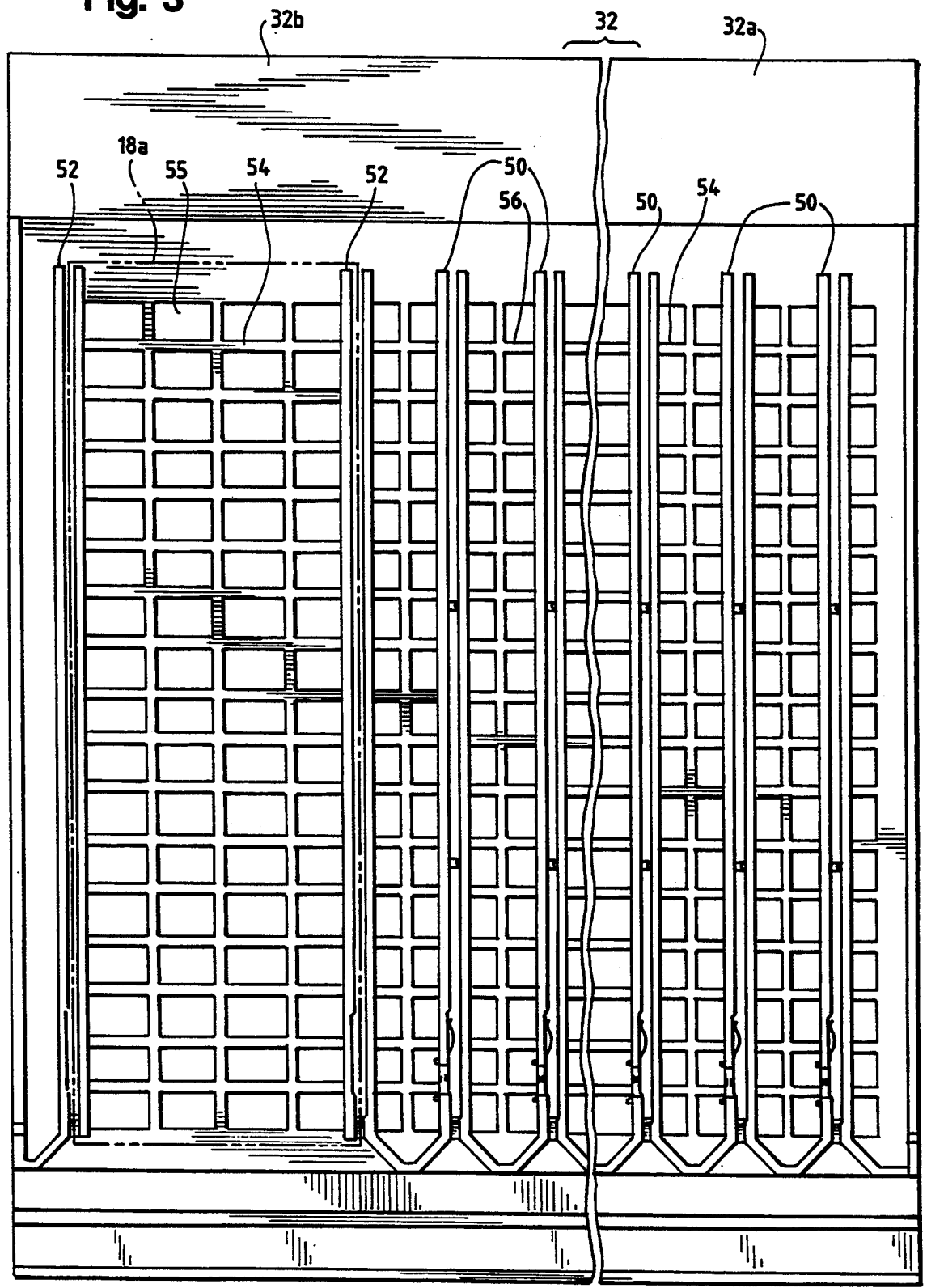
FIG. 3 is a top view of the card guide shown cut away in sections to remove redundant material.

FIG. 3 is a top view of the card or wave guide 32 which is fragmented to show the invention without unnecessarily illustrating duplicative material. In addition, only card or wave guide 32 is shown in detail since guide 30 is a substantially identical minor image. Wave guide 32 is separated into two portions, 32a and 32b. Portion 32a illustrates three of the molded channel guides 50, which are adapted to receive one of the electronic modules or cards 18b through 18k. FIG. 4 shows the details of one of the channel guides 50 with clarity. The channel guide 50 extends substantially the length of the wave guide 32. There are a plurality of channel guides 50, one for each electronic module 18b through 18k. Portion 32b illustrates two additional channel guides 50 for holding circuit boards such as the modules or cards 18b through 18k. Additionally, portion 32b supports two channel guides 52, which are adapted to receive a power supply 18a. In the preferred embodiment, the power supply module 18a is enclosed in metal so that EMI/RFI emissions are not leaked into the card cage. Accordingly, for practical purposes, the power supply module 18a is isolated and doesn't contribute to the need for a Faraday shield. Underlying all of the channel guides 50 and 52 is grid 54. Since the power supply module 18a is separately shielded, the openings 55 in the grid 54 are larger than the openings 56 in the grid underlying the modules or cards 18b through 18k. Because there is no source of EMI/RFI emissions adjacent the openings 55, these openings are slightly larger than openings 56 to allow greater air flow. In a preferred embodiment of the present invention, the size of each of the openings 55 is approximately 11.75 mm × 18.7 mm and 11.9 mm deep. Accordingly, the openings 55 are not considered in the determination of the openings 56 as discussed hereinafter. Of course, if a different component similar to the others was used in module 18a, then the openings 55 would be the same size as the openings 56 and the channel 52 would be the same as channel guides 50. There are a plurality of apertures or openings 56 forming the portion of the grid 54 subtending the modules or cards 18b through 18k. The size and depth of the openings 56 are chosen to balance the functional requirement of providing a Faraday shield preventing RFI/EMI emissions and yet permitting sufficient air flow through the card cage to dissipate the heat generated by the electronics without causing acoustic noise. The realization that the grid openings 56 can be relatively large and deep compared to typical Faraday shield openings and still block RFI/EMI emissions forms a portion of the structure of the Faraday shield card cage of the present invention. In the preferred embodiment, each aperture is approximately 11.75 mm × 12.3 mm and 11.9 mm deep. In the preferred embodiment, the openings 56 are rectangular, but the orientation of the rectangular openings is irrelevant. Furthermore, it will be appreciated by one of ordinary skill in the art that the geometric shape of the openings can be varied to accommodate any design. Each grid opening 56 has a depth, referred to as the Faraday shield thickness, that is at least fifty percent (50%) of the diagonal length of the maximum opening size. Furthermore, the greatest edge dimension of any grid opening 56 must be less than one-fourth the wavelength of the highest frequency of interest. In the preferred embodiment, the openings 56 are all uniform, but it is within the scope of the invention to provide openings of various sizes as long as the above referred to standards are met.

FIG. 4 is a cut away portion of the wave guide 32 and illustrates in detail a channel guide 50. The channel guide 50 comprises a left wall portion 62 and a right wall portion 64. The left wall portion 62 has a linear or straight portion 66 and an angled portion 68. The right wall portion 64 has a linear or straight portion 70 and an angled portion 72. The left linear wall portion 66 is spaced apart from and substantially parallel with the right linear wall portion 70. A bottom member 74 extends the entire length of the linear wall portions 66 and 70 and together therewith forms a substantially U-shaped channel 76. The front portion of the bottom member 74 slopes inwardly forming a ramp 78 to avoid having the front edge of the module or card 18 striking a squared corner. The ramp 78 together with the right angle portion 68 and the left angle portion 72 provide a centering structure to direct the module or card 18 into the U-shaped channel 76 of the channel guide 50. The front surface 80 has a guide hole 114 and a screw hole 116. The module or card 18 has a post or projection (FIG. 7) that fits into the guide hole 114 and once the module or card 18 is positioned within the channel guide 50 the front panel is screwed or otherwise fixed in place. Of course, there are a plurality of channel guides 50 across the surface of grid 54 of card guide 32. Each channel guide 50 is substantially parallel to the other channels. The top card guide 30 is a substantially identical mirror image of card guide 32 and has a plurality of oppositely facing channels, each of which cooperates with one of the channel guides 50 to receive and hold a module or card 18.

A recess 86 is formed in the side of the straight wall portion 66 that faces into the channel 76. The recess 86 is formed within the first quarter of the length of the straight wall portion 66. Two posts 90 and 92 are formed on the straight wall portion opposite to the recess 86. Additionally, a portion of the straight wall 66 is cut away to show the relationship of the aperture 56 to the grid 54.

An anti-static clip 94 straddles the straight wall portion 66 between the posts 90 and 92. The clip 94 is preferably made from nickel plated cooper and comprises a saddle or base portion 96, a short straight leg 98 which lies flat within the recess 86 and a bowed or hook portion 100 which extends into the channel 76. The saddle portion 96 fits over the wall 66 between the posts 90 and 92. As the card or module 18 is inserted into the channel 76 a static strip 102 along the bottom portion of the card 18 contacts the hook portion 100 of clip 94 and tends to flatten the hook portion 100 and extends it further along the recess 86.

Because the clip 94 is within the recess 86, the clip is restrained from being dragged along the length of the linear wall 66 when the card 18 is being inserted or removed. In order to insure that the clip remains in place the posts 90 and 92 capture the saddle portion 96 and prevent any movement of the clip 94. The contact between the clip 94 and the card 18 aligns or right justifies the position of the card 18 within the channel 76 so that the card 18 is properly connected to the backplane and guide hole 114. In the preferred embodiment, the hook portion 100 maintains contact with the strip 102 which extends the entire length of the card 18 and thereby discharges or dissipates any static electric charge. In the preferred embodiment the top card guide 30 does not have a recess since it does not use an anti-static clip. Of course, as an alternative embodiment, the top card guide has a corresponding structure and anti-static clip which contacts another static strip along the top of the card. Accordingly, it is within the scope of the present invention that the anti-static clip 94 could be used in both the bottom and bottom card guide 32 and 30 instead of only in the bottom card guide 32.

In addition, while only one clip 94 is used in the card guide 32 in the preferred embodiment, additional clips could be used along the length of the linear wall 66. Of course, if additional clips are used, corresponding recesses must be formed in the linear side wall and additional pairs of posts must be formed. It should also be understood that the anti-static clip could be attached to the right linear wall of the channel with the corresponding necessary structural modifications to the wall and the placement of the static strip on the opposite side of the card.

A rib 104 is molded into the channel 76 along the side of the right linear wall 70 facing the channel 76 and along the bottom 74. In the preferred embodiment, there are a plurality of ribs 104 spaced along each channel 76. As the module or card 18 is inserted into the channel 76 the bottom of the card 18 rests upon the portion of the ribs 104 across the bottom of the channel 76. A fib-like portion 105 extends from the right side wall 70 to prevent the card 18 from contacting the right side wall 70 as the card 18 is initially installed. In addition, as the anti-static clip 94 contacts the card 18, it right justifies the position of the card 18 by biasing it against the rib 104 along the right side wall 70. The ribs 104 protect the bottom 74 and right side wall 70 from wearing due to contact with the module or card 18. The number of ribs along each channel is a matter of design choice. In the preferred embodiment, there are no ribs in the top card guide since the module or card 18 is slightly shorter than the distance between the top and bottom card guides. Therefore, the top surface of the module or card does not contact the bottom of the channel in the top card guide and since there is no anti-static clip biasing the top of card 18 against the channel wall the need for the rib is eliminated.

FIG. 5 is a cross section taken along lines 5—5 of FIG. 4. The U-shaped channel 76 is positioned over the grid 54. In the preferred embodiment, the length of the bottom portion 74 of the U-shaped channel 76 is substantially the same length as the web of the grid 54 and the two wall portions 66 and 70 extend slightly over the openings 56 and the grid 54. The depth D of the grid 54 in the preferred embodiment is 11.9 min. The saddle portion 96 of clip 94 straddles the wall 66. As the card 18 is inserted into the channel the hook portion 100 of the clip 94 contacts the static strip 102 of card 18 contacting the hook 100. Because the card 18 is now electrically in contact with the channel guide 50 by the clip 94, any static charge build-up on the card will be harmlessly discharged or dissipated.

FIG. 6 is a cross section along line 6—6 of FIG. 4. The module or card 18 is within the U-shaped channel 76. The module or card 18 rides on the ribs 104 and accordingly does not contact either the bottom 74 or the wall 70. While the ribs 104 will eventually wear, the amount of contaminants released within the enclosure from these ribs is small compared to the contaminants released when the card 18 makes contact with the entire bottom 74 and side wall 70 of the channel 76. Further, even if the platting wears away from the ribs 104, there is only a small hole in the Faraday shield which is insufficient to leak emissions compared to the wearing away of the platting from the entire channel which leaves a significant hole in the shield.

FIG. 7 illustrates an exploded view of the power actuator switch assembly or interlock 110. A cut away of the module or card 18 is illustrated. The card 18 has a pin locator 112 which, upon insertion of the card into the channel guide 50 (FIG. 4), fits into the opening 114 in card guide 32. A larger screw hole 116 is also in the card guide 32. Of course, each module or card has a similar structure at the bottom as shown in FIG. 4. A screw 118 fits through the aperture 120 in the front of the card 18 and into the screw hole 116. The switch 110 has a front plate 122 which has two protrusions 124 and 126 which extend through apertures 128 and 130 in the front plate of card 18. A back plate 132 receives the two protrusions 124 and 126 from the backside of the front of the card 18. A switch circuit 140 having a toggle bat 142 cooperates with back plate 132. The switch 110 has two positions, on and off.

FIG. 8 shows the switch 110 in the off position and the screw 118 inserted into the hole 116, which is shown in phantom. In the off position, switch 110 is entirely below the screw hole 116. In this position, the screw 118 can be removed and the entire module or card 18 removed from the enclosure without affecting the other cards since the power to the module is off.

FIG. 9 shows the back side of switch 110. The back plate 132 has a receiving aperture in which the toggle bat 142 from switch circuit 140 is mounted on the card 18. In the off position, switch 110 holds the toggle bat 142 in a downward position thereby keeping switch circuit 140 off. As is well known, with switch 140 in the off position, the common power is removed from the module or card 18.

FIG. 10 illustrates the switch 110 in the off position with the face plate below the screw hole 116, the toggle bat 142 downward and the switch 140 off.

FIG. 11 illustrates the switch 110 in the on position with the face plate covering the screw 116, the toggle bat 142 is upward and switch 140 is on. Accordingly, power is supplied to the card 18.

Accordingly, when power is applied to the card 18, the switch 110 is in the on position and covers the screw 118. Therefore, it is not possible for someone to withdraw the module 18 without removing the screw 118 and the switch 110 must be moved to the off position in order to remove the screw 118. Of course, by moving the switch 110 to gain access to the screw 118, the switch 140 is turned off and power to the card is removed.

An enclosure for receiving and holding a plurality of electronic modules or cards and providing a Faraday shield to prevent EMI/RFI emissions has been disclosed. The Faraday shield comprises top and bottom molded plated plastic card guides that are mirror images. The size of the apertures in the card guide are chosen to balance the prevention of EMI/RFI emissions and the need to have an adequate air flow to dissipate heat without causing acoustic noise. The card guides have a plurality of channels for receiving the electronic modules or cards and at least some of these channels have an anti-static clip to dissipate any build up of static charge on the module or card. Furthermore, at least some of the channels of the card guides have wearable ribs which separate the card from at least the bottom and, in the preferred embodiment, the side wall of the channel, to prevent wear along the entire length of the channel. Finally, each module or card assembly has a mechanical interlock actuator switch assembly which prevents the module or card from being withdrawn from the card cage when the power is on. When the power to the card is on, the interlock assembly blocks access to a retaining screw which must be removed to release the module from the card cage. When the power to the card is off, the interlock assembly is moved, and the retaining screw becomes accessible. Of course, after the screw is removed, the module or card can be withdrawn from the card cage with the power to the module being off.

It will be understood that various changes in the details, arrangements and configurations of the parts and systems which have been described and illustrated above in order to explain the nature of the present invention may be made by those skilled in the art within the principle and scope of the present invention as expressed in the appended claims.

What is claimed is:

1. A device for preventing damage to a card cage by a circuit board, said card cage having a top, a bottom, a first side, a second side, a back and a front, wherein said top contains a plurality of top channels and said bottom contains a plurality of bottom channels, each of said top and bottom channels having a right side wall, a left side wall and a bottom, said channel bottom being substantially perpendicular to said first side and said second side, said bottom of said bottom channels being plated with conductive material to form part of a Faraday shield for preventing EMI/RFI radiation leakage from said card cage, said channels being oriented so that each top channel corresponds with a bottom channel to form a plurality of opposing channel pairs, each of said opposing channel pairs adapted to receive said circuit board, said circuit board having opposing edges in slidable engagement with one of said opposing channel pairs, said device comprising:

a plurality of ribs plated with conductive material to form part of a Faraday shield for preventing EMI/RFI radiation leakage from said card cage and extending along said bottom of each said bottom channel of each of said opposing channel pairs between said right side wall to said left side wall to prevent said circuit board from contacting said channel bottom during said slidable engagement and wearing away said conductive material plated to said bottom of each said bottom channel, thereby preventing a breach in said Faraday shield sufficiently large to leak EMI/RFI radiation from said card cage.

2. The device of claim 1, wherein a plurality of said ribs are spaced along the length of said at least one channel of each of said opposing channel pairs.

3. The device of claim 1, wherein said right side wall and said left side wall of each of said bottom channels is plated with conductive material to form part of a Faraday shield for preventing EMI/RFI radiation from said card cage, further comprising a plurality of second ribs extending along either said platted right side wall or said platted left side wall to said channel bottom to inhibit said circuit board from contacting said side wall along which said second rib extends during said slidable engagement and wearing away said conductive material plated to said side wall, thereby preventing a breach in said Faraday shield sufficiently large to leak EMI/RFI radiation from said card cage.

4. The device of claim 3, wherein each of said at least one second rib is positioned adjacent to said at least one rib.

5. The device of claim 1, wherein said at least one channel of each of said opposing channel pairs is contained by said bottom of said card cage.

* * * * *